(12) United States Patent
Hagelaar et al.

(10) Patent No.: US 9,537,062 B2
(45) Date of Patent: Jan. 3, 2017

(54) SOLID STATE LIGHT EMITTER PACKAGE, A LIGHT EMISSION DEVICE, A FLEXIBLE LED STRIP AND A LUMINAIRE

(71) Applicant: KONINKLIJKE PHILIPS N.V., Eindhoven (NL)

(72) Inventors: Joris Hubertus Antonius Hagelaar, Nuenen (NL); Grigory Alexandrovich Onushkin, Eindhoven (NL); Marcellus Jacobus Johannes Van Der Lubbe, Best (NL); René Theodorus Wegh, Veldhoven (NL); Rémy Cyrille Broersma, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/906,594

(22) PCT Filed: Dec. 11, 2014

(86) PCT No.: PCT/EP2014/077332
§ 371 (c)(1),
(2) Date: Jan. 21, 2016

(87) PCT Pub. No.: WO2015/091191
PCT Pub. Date: Jun. 25, 2015

(65) Prior Publication Data
US 2016/0284949 A1    Sep. 29, 2016

(30) Foreign Application Priority Data
Dec. 17, 2013  (EP) .................................. 13197726

(51) Int. Cl.
*H01L 33/50* (2010.01)
*H01L 33/00* (2010.01)
(Continued)

(52) U.S. Cl.
CPC ......... *H01L 33/504* (2013.01); *H01L 25/0753* (2013.01); *H01L 33/06* (2013.01);
(Continued)

(58) Field of Classification Search
CPC .......................... H01L 33/504; H01L 25/0753
(Continued)

(56) References Cited

U.S. PATENT DOCUMENTS

2004/0217364 A1   11/2004  Tarsa et al.
2009/0097240 A1   4/2009   Egawa
(Continued)

FOREIGN PATENT DOCUMENTS

DE    202011000007 U1   4/2012
JP    2007507910 A       3/2007
(Continued)

*Primary Examiner* — Moazzam Hossain

(57) ABSTRACT

A solid state light emitter package (200), a light emitting device, a flexible LED strip and a luminaire are provided. The solid state light emitter package comprising: i) at least three solid state light emitter dies (132, 142, 152) which emit violet/blue light, red light and further light, respectively, ii) a luminescent converter (120) with luminescent material, iii) an optical element (102, 105) for mixing at least portion of the light of the different colors of light and iv) a light exit window (114). The luminescent material at least partially converts the further light towards greenish light having a peak wavelength in the green or cyan spectral range and has a color emission distribution that is wide enough such that the solid state light emitter package is capable of emitting light with a high enough Color Rendering Index. The Color Rendering Index relates to light that has a color point close to the black body line.

15 Claims, 9 Drawing Sheets

(51) Int. Cl.
*H01L 33/08* (2010.01)
*H01L 33/18* (2010.01)
*H01L 33/26* (2010.01)
*H01L 25/075* (2006.01)
*H01L 33/56* (2010.01)
*H01L 33/58* (2010.01)
*H01L 33/48* (2010.01)
*H01L 33/06* (2010.01)

(52) U.S. Cl.
CPC ............ *H01L 33/486* (2013.01); *H01L 33/56* (2013.01); *H01L 33/58* (2013.01)

(58) Field of Classification Search
USPC .......................................................... 257/89
See application file for complete search history.

(56) References Cited

U.S. PATENT DOCUMENTS

| | | | |
|---|---|---|---|
| 2009/0114932 A1 | 5/2009 | Chou | |
| 2009/0121238 A1* | 5/2009 | Peck | F21V 13/04 257/89 |
| 2009/0315053 A1 | 12/2009 | Lee et al. | |
| 2010/0025700 A1 | 2/2010 | Jung et al. | |
| 2010/0290221 A1* | 11/2010 | Tarsa | H01L 25/0753 362/231 |
| 2011/0102706 A1* | 5/2011 | Oshio | H01L 25/0753 349/61 |
| 2011/0248293 A1* | 10/2011 | Chan | H01L 25/0753 257/89 |
| 2011/0291114 A1 | 12/2011 | Cheng | |
| 2012/0007502 A1* | 1/2012 | Jung | H01L 25/0753 313/512 |
| 2012/0211781 A1* | 8/2012 | Lee | C09K 11/7734 257/89 |

FOREIGN PATENT DOCUMENTS

| | | |
|---|---|---|
| JP | 2009231027 A1 | 10/2009 |
| JP | 2009239242 A | 10/2009 |
| JP | 2010034184 A | 2/2010 |
| JP | 2013051375 A | 3/2013 |
| WO | 2008026851 A1 | 3/2008 |
| WO | WO2012090356 A1 | 7/2012 |

* cited by examiner

SOLID STATE LIGHT EMITTER PACKAGE, A LIGHT EMISSION DEVICE, A FLEXIBLE LED STRIP AND A LUMINAIRE

CROSS-REFERENCE TO PRIOR APPLICATIONS

This application is the U.S. National Phase application under 35 U.S.C. §371 of International Application No. PCT/EP2014/077332, filed on Dec. 11, 2014, which claims the benefit European Patent Application No. 13197726.6, filed on Dec. 17, 2013. These applications are hereby incorporated by reference herein.

FIELD OF THE INVENTION

The invention relates to solid state light emitter packages which comprise several solid state light emitters emitting light at different colors.

BACKGROUND OF THE INVENTION

With respect to the integration of a Light Emitting Diode (LED) die in an lighting application several levels of packaging/integration may be distinguished. Level 0 is the LED die itself. A LED die is, for example, not suitable for being soldered directly to a printed circuit board and must be integrated into a package and must be equipped with, for example, wire bonds. A level 1 integration is a first level of packaging of the LED die such that the LED die cannot be touched anymore by a person and such that the LED die can be connected to other circuitries. In the level 1 package the LED die is, often, connected with wire bonds to external contacts of the level 1 package. A subsequent level of integration level is providing the Level 1 LED package to, for example, a printed circuit board.

Today several lighting application comprise Level 1 LED packages in which several LED dies are integrated in a single packets. These LED packages may comprise, for example, a blue emitting LED die, a green emitting LED die and a red emitting LED die such that by providing a specific driving signal to each one of these LED dies, a multitude of emitted colors of light may be emitted by the Level 1 LED package. A gamut of such LED packages is relatively large. The LED packages with several LED dies that each emit another color may be used on, for example, flexible LED strips (in which a flexible strip acts as a printed circuit board) which are used for decorative lighting that may emit a controllable color of light.

By using blue emitting LED die, a green emitting LED die and a red emitting LED die one may generate colors of light within a relatively large portion of, for example, the CIE XYZ color space. However, the fact that about all colors of light may be generated by combining light emissions of blue emitting, a green emitting and a red emitting LED dies does not guarantee that the color rending of the emitted light is good. The blue emitting LED die, a green emitting LED die and a red emitting LED die emit light in a relatively narrow light emission spectrum which have, for example, a Full Width Half maximum value of 30 nanometers. When such narrow light emissions are combined, the light emission may have a color point close to the black body line in the CIE XYZ color space (and, thus appear white to the human naked eye), but the Color Rendering Index (CRI) of the emitted light will be relatively low. Thus, the Level 1 LED packages comprising blue emitting, a green emitting and a red emitting LED dies are not suitable for use as the main functional lighting, but are only suitable for decorative lighting purposes.

Published patent application US2009/0114932 discloses a light emitting diode light engine includes a substrate for supporting the LED light engine. The light emitting diode light engine comprises LEDs which include red LEDs, green LEDs and blue LEDs. Each of the blue LEDs is at least partially covered with a yellow phosphor coating compound. The concentration of the yellow phosphor coating compound is controlled to allow the emission of blue and yellow spectrum light energy from each blue LED. Emissions of light energy from the red LEDs, green LEDs and blue LEDs are combined to achieve a target correlated color temperature and a target color rendering index for the LED light engine.

The light emitting diode engine according to the above cited patent application is design to emit a color of light which is close to the black body line. This is done by using blue LEDs which are covered with a yellow phosphor such that relatively white light is generated. The green LEDs and red LEDs are used to control the color of the emitted light even better and, more in particular, to obtain a light emission that has a relatively high color rending index. The light emitting diode engine of the cited patent has the purpose to emit white light and does not have the purpose to emit a controllable color of light. At least is the gamut of the light emitting diode engine of the cited patent relatively small.

Document WO2008/026851A1 discloses a light emitting device comprising a first light emitting diode for emitting light in an ultraviolet wavelength region. At least one phosphor arranged around the first light emitting diode and excited by the light emitted from the first light emitting diode to emit light having a peak wavelength longer than the wavelength of the light emitted from the first light emitting diode. At least one second light emitting diode for emitting light having a wavelength different from the peak wavelength of the light emitted from the phosphor. According to this document, there is provided a white light emitting device, wherein using a light emitting diode for emitting light different in wavelength from light that is ex-cititively emitted from the phosphor, an excitation light source, i.e., light in the ultraviolet region for exciting the phosphor is effectively used, thereby improving energy conversion efficiency and improving reliability.

Document DE202011000007U1 discloses an arrangement for the generation of white light, comprising a support element, a first on the support element arranged LED for producing red light, a second on the support element arranged LED to produce blue and/or ultraviolet light, and a light-influencing element which is constructed and arranged such that at least part of the light of the second LED is converted into green light especially into a mint-green and/or greenish white light.

Document US2004/0217364A1 discloses a white light emitting lamp comprising a solid state ultra violet (UV) emitter that emits light in the UV wavelength spectrum. A conversion material is arranged to absorb at least some of the light emitting from the UV emitter and re-emit light at one or more different wavelengths of light. One or more complimentary solid state emitters are included that emit at different wavelengths of light than the UV emitter and the conversion material. The lamp emits a white light combination of light emitted from the complimentary emitters and from the conversion material. According to the disclosure, the white light having high efficacy and good color rendering. Other embodiments of white light emitting lamp according to the present invention comprises a solid state laser instead of a UV emitter. A high flux white emitting lamp embodiment comprises a large area light emitting diode that emits light at a first wavelength spectrum and includes a conversion material. A plurality of complimentary solid state emitters surround the large area LED, with each emitter emitting light in a spectrum different from the large area LED and conversion material such that the lamp emits a balanced white light. Scattering particles can be included in each of the embodiments to scatter the light from the emitters, conversion material and complimentary emitters to provide a more uniform emission.

Document US2011/0291114A1 discloses a light-emitting diode (LED) package structure that includes a substrate, a first LED, a second LED, and a resin material. At least one enclosure made of a transparent material is formed on a surface of the substrate, and encloses and forms at least one area on the substrate. The first LED and the second LED are disposed in the area and adjacent to each other, and the resin material is disposed in the area, and covers the first LED and the second LED. The LED package structure obtains desired illuminating lights by mixing lights respectively emitted by the first LED and the second LED.

SUMMARY OF THE INVENTION

It is an object of the invention to provide a solid state light emitter package which is capable of emitting light of a multitude of colors and which is capable of emitting light having a color point near a black body line and which is of a high quality.

As defined in the claims, an aspect of the invention provides a solid state emitter package, another aspect provides a light emission device, a further aspect provides a flexible LED strip and a last aspect provides a luminaire. Advantageous embodiments are defined in the dependent claims.

A solid state light emitter package in accordance with the first aspect of the invention comprises a blue emitting solid state light emitter die, a red emitting solid state light emitter die, a further solid state light emitter die, a luminescent converter, a light exit window and an optical element. The blue emitting solid state light emitter die is configured to emit violet/blue light when it receives electrical power. The red emitting solid state light emitter die is configured to emit red light when it receives electrical power. The further solid state light emitter die is configured to emit further light when it receives electrical power. The further light comprises light of wavelengths in at least one of the ultra violet, violet or blue spectral ranges. The luminescent converter comprises luminescent material. The luminescent converter being arranged at a position in the solid state light emitter package where it may receive the further light. The luminescent material is configured to absorb light within an absorption color distribution and to convert a portion of the absorbed light towards greenish light according to an emission color distribution. The absorption color distribution at least partially overlaps with wavelengths of the further light and the emission color distribution has a peak wavelength in the green spectral range and has a specific width for obtaining a Color Rendering Index that is higher than a predefined minimum. The Color Rendering Index relates to light emitted by the solid state light emitter when the solid state light emitter emits light of a color point close to a black body line. The light exit window is for transmitting light into an ambient of the solid state light emitter package. The optical element is configured for mixing a portion of the greenish light with at least one of a portion of the violet/blue light and a portion of the red light before the light is emitted through the light exit window.

The solid state light emitter package is capable to emit color of light in a relatively large portion of the CIE color space because by controlling the driving of the blue emitting solid state light emitter, the red emitting solid state light emitter and the further solid state light emitter it may be controlled how violet/blue light, red light and greenish light are mixed to obtain a specific color of light. Because the luminescent material converts the further light towards light that appears to the human naked eye as green or greenish, the gamut of the solid state light emitter package is still relatively large and it may only be difficult to generate light with a color point of pure green light. Furthermore, because the emission color distribution is wide enough (when, for example, expressed with its full width half maximum (FWHM) width value), the color rending index (CRI) of this emitted light is relatively high when all three solid state light emitters are controlled to emit light such that a color point close to the black body line is obtained. The relatively wide emission color distribution contributes to the fact that the complete light emission spectrum, when all three solid state light emitters emit light, has only a few relatively small wavelength ranges in which the emitted amount of light is low and, consequently, the CRI is relatively high. Light with a relatively high CRI is seen as light of a high quality. It is to be noted that the predefined minimum CRI is, in an embodiment, 70, or, in another embodiment, 75, or, in a further embodiment, 80. In an embodiment, a color point is close to the black body line when the color point is within 7 SDCM to the black body line. In another embodiment, a color point is close to the black body line when the color point is within 5 SDCM to the black body line. In a further embodiment, a color point is close to the black body line when the color point is within 3 SDCM to the black body line.

In order to prevent that the separate solid state light emitter dies are individually visible to the human naked eye, the solid state light emitter package comprises optical means which contributes at least to the effect that different color of light are mixed and, thus, that the human naked eye experiences, up to a certain degree, a uniform color distribution along the light exit window. Such a relatively uniform color distribution along the light exit window is also a high quality light emission.

Greenish means that the light appears to the human eye as light that is in between the colors blue and yellow and of which a human concludes that it comprises at least wavelengths in the green spectral range. This includes light of which appears fully green to the human naked eye, but may also include cyan, lime, olive, turquoise, mint.

The further solid state light emitter emits light in the UV and/or blue spectral range. This has as a consequence that the luminescent material must be configured to have the absorption color distribution that overlaps (at least partially) with the spectrum of the further light. In an embodiment, the absorption color distribution overlaps (completely) with the spectrum of the further light.

It is to be noted that the luminescent converter may comprise more than one luminescent material. One may, for example, use two, three or more luminescent materials of which the absorption color distribution at least partially overlaps with the spectrum of the further light and which emit greenish light.

The further light is in the blue, the violet or the ultra violet spectral range. The blue spectral range is from about 450 to 495 nanometers. The violet spectral range is from about 380 to 450 nanometers. Ultra violet light has a wavelength lower than 380 nanometers (and in general higher than 10 nanometers). The blue emitting solid state light emitter die emits violet/blue light, which means that a peak wavelength of the emitted light distribution is in a range from 380 to 495 nanometers.

The red emitting solid state light emitter die is arranged in between the blue emitting solid state light emitter die and the further solid state light emitter die. If the blue emitting solid state light emitter die and the further solid state light emitter die are both arranged at another side of the red emitting solid state light emitter die, than the violet/blue light may, in a specific embodiment, for the largest part not impinge on the luminescent material of the luminescent converter and, as such, most of the violet/blue light shall not be converted towards greenish light. Thus, in other words, the blue emitting solid state light emitter die is not surrounded by luminescent material and, as such, most of the violet/blue light is emitted into the ambient without being converted towards greenish light. Such a conversion of the violet/blue light towards greenish light is not always desired because it limits the gamut of the solid state light emitter. However, in practical embodiments, a relatively small portion (smaller than 10%) of the violet/blue light might be converted towards greenish light and thereby the color point of the violet/blue light with the converted light shifts only along a minor distance from pure blue towards a color point of pure green. The term "in between" does not only mean that when a straight line is drawn from the blue emitting solid state light emitter die towards the further solid state light emitting die, that the red emitting solid state light emitting die is exactly on this line. The red emitting solid state light emitting die may also be close to this line. In an embodiment, the term "in between" is defined by: when a first virtual line is drawn from a center of the red emitting solid state light emitter die towards a center of the blue emitting solid state light emitter die and a second virtual line is drawn from the center of the red emitting solid state light emitter die towards a center of the further solid state light emitter die, a smallest angle between the first virtual line and the second virtual line is in the range from 120 degrees up to 180 degrees.

In an embodiment about all further light is absorbed by the luminescent material and converted towards the greenish light. Thus the amount of luminescent material should be high enough to absorb about all photons of the further light such that about no further light is emitted by the solid state light emitter package when the further solid state light emitter die generates light.

Optionally, the peak wavelength of the emission color distribution is within the range from 490 nanometer to 570 nanometer. In an embodiment, the peak wavelength of the emission color distribution is within the range from 500 nanometer to 560 nanometer, or, in a further embodiment within a range from 505 nanometer to 550 nanometer.

Optionally, a full width half maximum (FWHM) spectral width of the emission color distribution is at least 40 nanometer for increasing a Color Rendering Index of light emitted by the solid state light emitter when the solid state light emitter emits light of a color point close to a black body line. In another optional embodiment, the FWHM spectral width is at least 55. In a further embodiment, the FWHM spectral width is at least 70.

Optionally, when the further solid state light emitter emits further light and if the further light is light in the blue spectral range, a portion at least 30% of the further light is absorbed by the luminescent material and a combination of the greenish light and a remaining portion of the further light is emitted through the light exit window. Thus, the light emission which is the combination of the greenish light and the remaining further light has a color point in between blue and green. Consequently, the gamut of the solid state light emitter packages reduces, but it may still be possible to generate light of many different colors and a large portion of the black body line may fall within the gamut such that white light if different color temperatures can be generated by the solid state light emitter package. As will be discussed later, one may add a green emitting light emitter die for enlarging the gamut of the solid state light emitter packages towards the green region of the CIEXYX color space. With respect to this optional embodiment: the optical element may be arranged to at least partially mix the further light and the greenish light with at least one of the red light and the violet/blue light. Furthermore, when inorganic phosphors are used for the luminescent material, the luminescent converter becomes part of the optical element because the inorganic phosphor particles scatter the received light and thereby assist in the mixing of light of different colors. In another embodiment, at least 40% of the further light is converted. In a further embodiment, at least 50% of the further light is converted towards greenish light.

Optionally, the luminescent converter is a layer of the luminescent material that is provided on a light emitting surface of the further solid state light emitter. When the further solid state light emitter die comprises more than one light emitting surface, all the light emitting surface may be covered with the layer of luminescent material. In this optional embodiment, the luminescent material is substantially resistant to heat, because the further solid state light emitter die may become relatively warm—in this optional embodiment the luminescent material may be an inorganic phosphor.

Optionally, the luminescent converter comprises a first light transmitting material in which the luminescent material is distributed, light emitting surfaces of the further solid state light emitter are covered by the first light transmitting material. Providing the luminescent material in the first light transmitting material (such as, for example, in Silicone, or in another resin, in glass, or a transparent synthetic material, etc.) has several advantages: i) the greenish light is scattered in the luminescent converter and, as such, emitted along a larger light emission surface; ii) the heat generated in the luminescent material may be conducted away by the first light transmitting material and, for example, iii) the luminescent material is not directly in contact with the second blue emitting solid state light emitter die and, as such, does not directly receive the heat of the further solid state light emitting die (which prevents that the conversion efficiency of the luminescent material drops too much).

Optionally, light emitting surfaces of the red emitting solid state light emitter are also covered by the first light transmitting material of the luminescent converter thereby obtaining the optical means which at least partially mixes the greenish light with the red light. In this optional embodiment it is assumed that the luminescent material does not absorb the red light. Thus, the luminescent material in the first light transmitting material does scatter the red light (as it also does with the greenish light) and thereby an automatic light mixing is obtained within the first light transmitting material. Thus, in a relatively efficient and effective way the red light and the greenish light are mixed. It is to be noted that, in a further embodiment, the absorption color distribution does not much overlap with the color distribution of the violet/blue light, which prevents that much light that is emitted by the violet/blue light emitting solid state light emitter die is converted towards greenish light.

Optionally, the absorption color distribution of the luminescent material may overlap with the spectrum of the violet/blue light to such an extent that not more than 30% of the violet/blue light is absorbed by the luminescent material, and wherein the light emitting surfaces of the blue emitting solid state light emitter die are also covered by the first light transmitting material thereby obtaining the optical means which at least partially mixes the greenish light with the violet/blue light. When the luminescent material only absorbs a relatively small portion of the light emitted by the blue emitting solid state light emitter die, the luminescent material does not convert the violet/blue light towards greenish light and, as such, the gamut of the solid state light emitter package is maintained relatively large. It may be advantageous to use the first light transmitting material with the luminescent material in front of the blue emitting solid state light emitter die also because it scatters the violet/blue light and thereby improves the color mixing of the violet/blue light and the greenish light, and also of the red light when the red emitting solid state light emitter die is also covered by the first light transmitting material comprising the luminescent material. In another embodiment, not more than 20% of the violet/blue light is absorbed by the luminescent material. In a further embodiment, not more than 10% of the violet/blue light is absorbed by the luminescent material.

Optionally, the optical element comprise a second light transmitting material that is optically coupled to the luminescent converter and at least one of: light emitting surfaces of the blue emitting solid state light emitter and light emitting surfaces the red emitting solid state light emitter. The second light transmitting material receives at least a portion of the greenish light and at least one of the violet/blue light and the red light as the result of the optically coupling. As such the optical means may mix the received light of different colors. The optical means of the second light transmitting material may also be configured to guide the light towards the light exit window for transmission the light into the ambient of solid state light emitter package. Optically coupled may imply that the second light transmitting material may be in direct contact with the light emitting surfaces and the luminescent converter, but it also implies that other optical elements may be provided in between the second light transmitting material and said other elements. The second light transmitting material may, for example, be Silicone, PMMA, or another light transmitting resin or synthetic material. The second light transmitting material may also be made of glass.

Optionally, the optical means further comprises a light transmitting wall arranged in between the second light transmitting material and the luminescent converter. It may be advantageous to physically separate the luminescent converter from the second light transmitting material, more in particular when it is required to define an exact transition between the luminescent converter and the luminescent material. For example, when the optical element is, for example, manufactured by dispensing Silicone at a particular location near the blue emitting solid state light emitter die, and the luminescent converter is manufactured by dispensing Silicone comprising the luminescent material at a particular location near the further solid state light emitter die, such a separation wall may be used to exactly define a location of the transition from the second light transmitting material to the luminescent converter.

Optionally, a method for manufacturing a solid state light emitter package is provided. The method comprises: i) providing a blue emitting solid state light emitter die on a base which may be a substrate or a printed circuit board, the blue emitting solid state light emitter die is configured to emit violet/blue light; ii) providing a further solid state light emitter die on the base, the further solid state light emitter die is configured to emit further light comprising light of wavelengths in at least one of ultra violet, violet or blue spectral ranges; iii) providing a red emitting solid state light emitter die on the base at a position in between the blue emitting solid state light emitter die and the further solid state light emitter die, the red emitting solid state light emitter die is configured to emit red light, in between meaning that an angle between a first straight line and a second straight line is in the range from 120 degrees up to 180 degrees, the first straight line is from the red emitting solid state emitter die to the blue emitting solid state light emitter die and the second straight line is from the red emitting solid state light emitter die to the further solid state light emitter die; iv) providing a light transmitting wall on the base, wherein the further solid state light emitter die is arranged at a first side of the light transmitting wall and the blue emitting solid state light emitter die is arranged at a second side of the light transmitting wall, the second side being opposite the first side, v) dispensing a first portion of light transmitting resin at a particular location at the second side of the light transmitting wall; vi) dispensing a second portion of light transmitting material comprising a luminescent material at a particular location at the first side of the light transmitting wall for forming a luminescent converter, wherein the luminescent being arranged to receive the further light, the luminescent material is configured to absorb light within an absorption color distribution and to convert a portion of the absorbed light towards greenish light according to an emission color distribution, the absorption color distribution at least partially overlapping with wavelengths of the further light, the emission color distribution having a peak wavelength in at least one of the cyan or green spectral range and having a specific width for obtaining a Color Rendering Index that is higher than a predefined minimum, the Color Rendering Index relates to light emitted by the solid state light emitter package when the solid state light emitter package emits light of a color point close to a black body line. Optionally, the light transmitting resin is Silicone. Optionally, the method comprises a step of curing the light transmitting resin. Optionally, the first portion of light transmitting material is dispensed near the blue emitting solid state light emitter. Optionally, the second portion of light transmitting material comprising the luminescent material is dispensed near the further solid state light emitter die. It is to be noted that dispensing such materials at such location can also be performed without light transmitting wall and when the amounts (and/or moments of dispensing) are well-controlled according to a predefined schedule the first portion of the light transmitting material and the second portion of the light transmitting material may contact each other at a well-defined location. Optionally, the luminescent material is one of an organic phosphor, an inorganic phosphor, and particles showing quantum confinement and having at least in one dimension a size in the nanometer range, wherein examples of the particles are: quantum dots, quantum rods and quantum tetrapods. Of course, the luminescent material must be suitable for use in the solid state light emitter package and, thus, the absorption color distribution has to, at least partially, overlap with the wavelengths of the further light and an emission color distribution has at least a peak wavelength in the cyan or green spectral range and a width of the emission color distribution is large enough to obtain a high enough Color Rendering Index.

Optionally, the solid state light emitter package may further comprise an additional blue emitting solid state light emitter die for emitting additional violet/blue light. The additional blue emitting solid state light emitter die being provided with a further luminescent material which at least absorbs a portion of the additional violet/blue light and which converts the absorbed light to a color emission distribution which has a peak wavelength in the yellow or orange spectral range. The additional blue emitting solid state light emitter die with the luminescent material being configured to emit light having a color point close to the black body line. Thus, an additional light emitter is provided which essentially emits light that is experienced by the human naked eye as white light. The additional light emitter increases the possible light output when the solid state light emitter has to emit light with a color point close to the black body line. Furthermore, the additional light emitter increases the CRI of the light with the color point close to the black body line. Also, the use of such an additional light emitter increases the gamut of the solid state light emitter package. The yellow spectral range is from 570 to 590 nanometers and the orange spectral range is from 590 to 620 nanometers.

Optionally, the solid state light emitter package may further comprise a green emitting solid state light emitter die for emitting green light. The green emitting solid state light emitter die increases the gamut of the solid state light emitter package. Green light has a peak wavelength in the spectral range from 495 to 570 nanometers.

Optionally, said solid state light emitter dies are Light Emitting Diode dies.

According to another aspect of the invention, a light emission device is provided which comprises at least one solid stat light emitter according to the previously discussed aspect of the invention. The light emission device also comprises a substrate provided with electrical conductive tacks to which the at least one solid state light emitter package is electrically coupled. The light emission device is a level 2 integration of a solid state light emitter. The substrate may be a rigid structure (for example, a printed circuit board) or may be a flexible substrate.

According to a further aspect of the invention, a flexible LED strip is provided. The flexible LED strip comprises the light emission device according the another aspect of the invention that is discussed above. In the flexible LED strips, the substrate is flexible and has an elongated shape. On the substrate are provided a plurality of solid state light emitter devices and said solid state light emitting dies are Light Emitting Diode dies.

According to a last aspect of the invention, a luminaire is provided which comprises the solid state light emitter packages, or the light emission device or the flexible LED strip.

The light emission device, the flexible LED strip and/or the luminaire provide the same benefits as the solid state light emitter package according to the first discussed aspect of the invention and has similar embodiments with similar effects as the corresponding embodiments of the solid state light emitter package.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of light emission device and/or the flexible LED strip, which correspond to the described modifications and variations of the solid state light emitter package, can be carried out by a person skilled in the art on the basis of the present description.

Figure 1A:
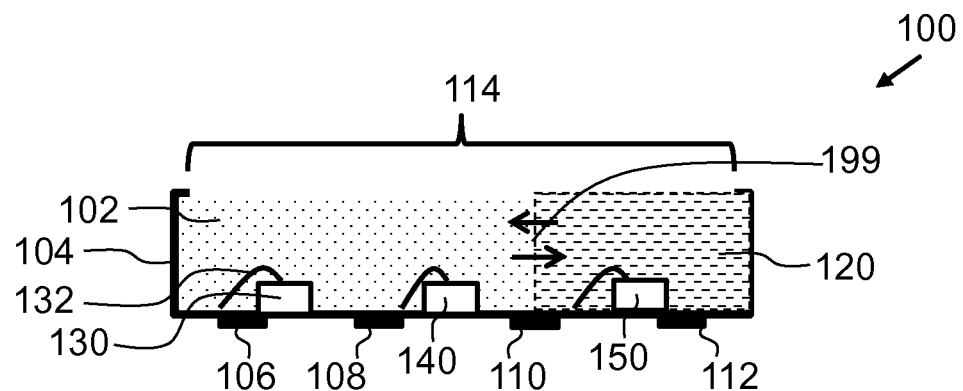
FIGS. 1a to 1c schematically show embodiments of solid state light emitter packages, FIGS. 2a to 2c schematically show embodiments of solid state light emitter packages, FIG. 3a schematically shows an embodiment of a solid state light emitter package, FIG. 3b schematically shows some light emission spectra and an absorption color distribution, FIG. 4a schematically shows an embodiment of a light emission device, FIG. 4b schematically shows an embodiment of a flexible LED strip, FIG. 4c schematically shows an embodiment of a luminaire.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

In the following of this description specific embodiments are discussed by using specific terms. It must be noted that when the term blue emitting or (first or second) blue light is used, also violet emitting or violet light is meant. The embodiments of the second blue light and second blue emitting solid state light emitter die are embodiments falling within the scope of the term further light and further solid state light emitter as provided in the claims. Thus, instead of second blue light, one may also read violet light or ultra violet light, and instead of second blue emitting solid state light emitter die, one may also read ultra violet emitting solid state light emitter die or violet emitting solid state light emitter die.

Figure 1B:
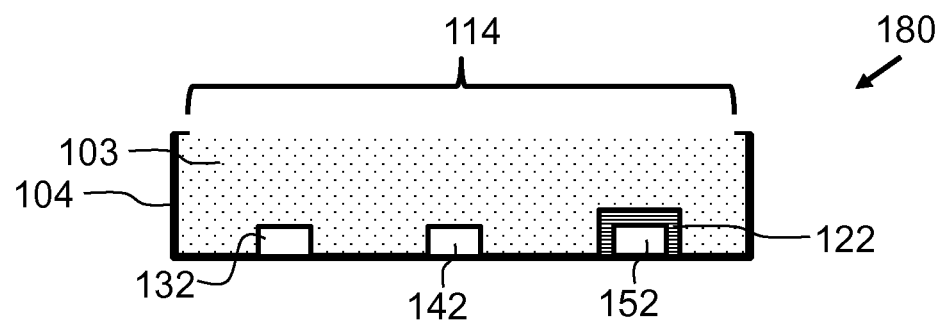
Figure 1C:
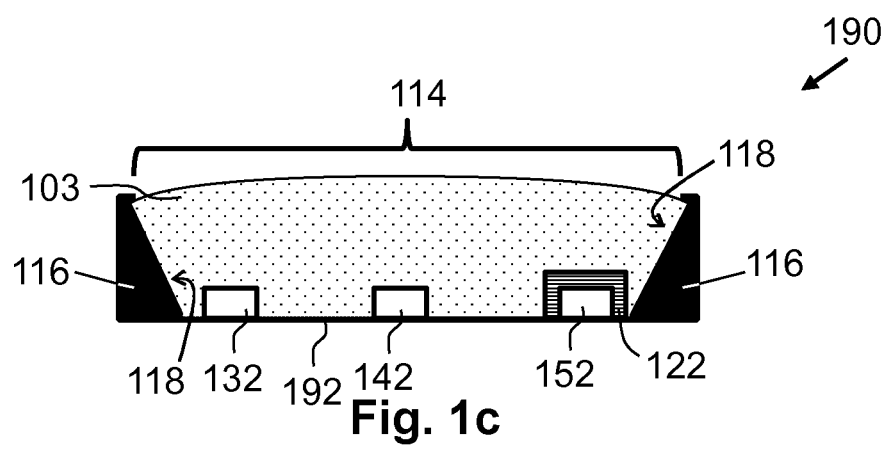

FIGS. 1a to 1c schematically show embodiments of solid state light emitter packages 100, 180, 190. A first embodiment is shown in FIG. 1a. FIG. 1a schematically presents a cross-sectional view of a Level 1 solid state light emitter package 100 comprising solid state light emitter dies 130, 140, 150. The solid state light emitter package 100 has an outer surface 104 which may be a sort of housing, but it will be seen later on that the outer surface 104 may also consists of, for example, a substrate on which walls of a particular shape are provided. The solid state light emitter package 100 has a light exit window 114 through which light that is generated by the solid state light emitter package 100 is emitted into an ambient of the solid state light emitter package 100. At the bottom side of the solid state light emitter package 100 are drawn electrical contacts 106, 108, 110, 112 which may be used to solder the solid state light emitter package 100 to, for example, a printed circuit board. In subsequent figures the electrical contacts 106, 108, 110, 112 are not drawn, but all subsequent embodiments of the solid state light emitter package may have electrical contacts such as the drawn electrical contact 106, 108, 110, 112, but may also have electrical contacts at another position of the solid state light emitter package. In the solid state light emitter package 100 are drawn three solid state light emitter dies 130, 140, 150, for example, dies of Light Emitting Diodes. The drawn solid state light emitter dies 130, 140, 150 have one electrode at their bottom surface and one at their top surface. As shown in FIG. 1a, the solid state light emitter dies 130, 140, 150 are placed with their bottom surface on a bottom plate of the solid state light emitter package 100 and their top surface is connected with a wire bond 132 such that the solid state light emitter dies 130, 140, 150 may be provided with electrical energy when such electrical energy is provided via the electrical contacts 106, 108, 110, 112. A first solid state light emitter die 130 is a first blue emitting solid state light emitting die 130. If a solid state light emitter die is a blue emitting solid state light emitting die 130, the die itself emits first blue light according to a first light emission distribution and this characteristic is determined by the specifically used materials in the first blue emitting solid state light emitting die 130, such as, for example, the used semiconductor material and the used dopants. Solid state light emitter die 140 is a red emitting solid state light emitter die 140 which emits red light according to a second light emission distribution. Solid state light emitter die 150 is a second blue emitting solid state light emitting die 150 which emits second blue light according to a third light emission distribution. In an embodiment, the first blue emitting solid state light emitter 130 and the second blue emitting solid state light emitter 150 are equal to each other and, thus, the first light emission distribution is equal to the second light emission distribution. In another embodiment, the first blue emitting solid state light emitter 130 and the second blue emitting solid state light emitter 150 are not equal to each other and, thus, the first light emission distribution does not overlap or only partially overlaps with the second light emission distribution. When the first blue emitting solid state light emitter 130 and the second blue emitting solid state light emitter 150 are not equal to each other, the overlap between the first light emission distribution and the second light emission distribution is not more than 30%. The solid state light emitter package 100 further comprises a luminescent converter 120 which is provided on top of the second blue light emitting solid state light emitter die 150. The luminescent converter comprises luminescent material which is configured to absorb light within an absorption color distribution and to convert a portion of the absorbed light energy towards greenish light according to an emission color distribution. The absorption color distribution at least partially overlaps with wavelengths of the second blue light, thus, at least partially overlaps with the third light emission distribution. In an embodiment, the third light emission distribution is fully overlapped by the absorption color distribution. The emission color distribution of the luminescent material has a peak wavelength in the cyan or green spectral range and has a full width half maximum spectral width of at least 40 nanometers, and in another embodiment, of at least 50 nanometers, and in yet a further embodiment of at least 60 nanometers. The luminescent converter 120 may further comprise Silicone, or another specific matrix polymer (such as, for example PMMA), in which the luminescent material is dispersed. The light that is emitted by the second blue emitting solid state light emitter die 150 is emitted into the luminescent converter and the second blue light is absorbed and converted towards greenish light. The greenish light is at least partially emitted through the light exit window 114, and may also be emitted in a sideward direction. The solid state light emitter 100 further comprises an optical element 102. The optical element 102 comprises a light transmitting material such as, for example in the embodiment of FIG. 1a, Silicone that is in direct contact with the first blue emitting solid state light emitter die 130, in direct contact with the red emitting solid state light emitter die 140 and which is optically coupled to the luminescent converter 120. The optical element 102 is at least configured to partially mix a portion of the greenish light with at least one of a portion of the first blue light and a portion of the red light. The mixing is performed before the light is emitted through the light exit window. As the result of the optically coupling between the optical element 102 and the luminescent converter 120, as shown at location 199 in FIG. 1a, light that is trapped within the optical element 102 may be transmitted into the luminescent converter and greenish light that is emitted in a sidewards direction is transmitted into the optical element 102. This results in mixing at least a portion of the greenish light with some red light and/or with some of the first blue light.

In the above embodiment, the solid state light emitter dies 130, 140, 150 which are electrically connected with a wire bond, may also be replaced by so-termed flip-chip solid state light emitter dies as will be discussed in subsequent embodiments.

In the above embodiment, and also in the subsequently discussed embodiments, the term greenish light is being used. Greenish light means that the human naked eye would characterize the color of the light as light belonging to the green-color-family. Greenish light includes green light, but also, for example, cyan, mint, olive, turquoise, lime colored light. Seen on the wavelength scale, greenish light is, in general, in between yellow and blue light. The luminescent material emits light according to an emission color distribution and a peak wavelength of this emission color distribution is in the cyan spectral range or the green spectral range, which ranges from about 490 to about 520 nanometer and 520 nanometer to about 570 nanometer, respectively. The emission color distribution is a relatively wide distribution, which means that the Full Width Half Length (FWHM) value of the emission color distribution is at least 40 nanometers. The tails of the emission color distribution may even extend into the yellow or blue spectral range.

In another embodiment, the peak wavelength of the emission color distribution in a range from about 500 nanometer to about 560 nanometer. In a further embodiment, the peak wavelength of the emission color distribution in a range from about 505 nanometer to about 550 nanometer. In an additional embodiment, the FWM value of the emission color distribution is at least 50 nanometer. In a further additional embodiment, the FWM value of the emission color distribution is at least 60 nanometer.

The luminescent material may be one of: an organic phosphor, an inorganic phosphor, and particles showing quantum confinement and having at least in one dimension a size in the nanometer range, wherein examples of the particles are: quantum dots, quantum rods and quantum tetrapods.

Figure 2A:
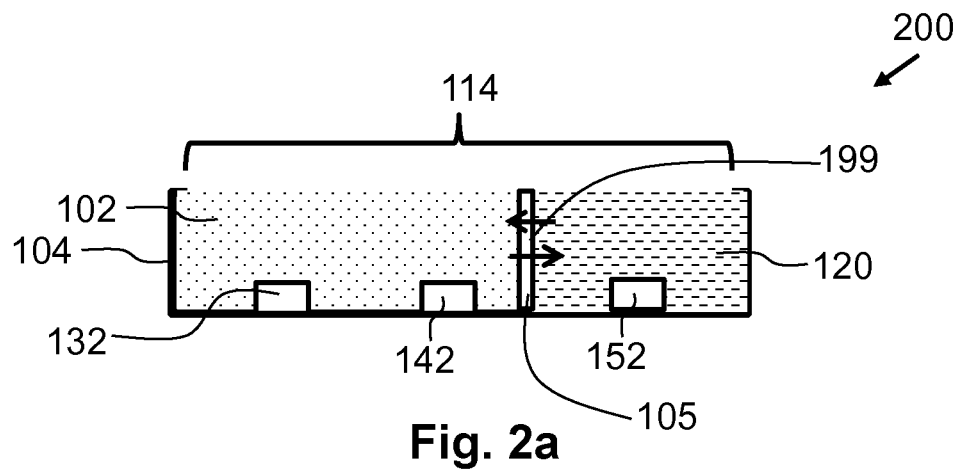
Figure 2B:
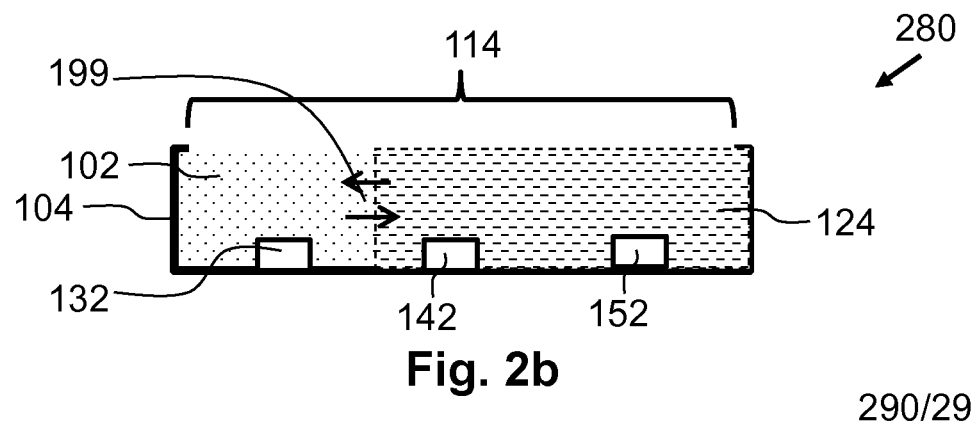
Figure 2C:

More in particular, examples of suitable inorganic phosphors are:

$Lu_{1-x-y-a-b}Y_xGd_y)_3(Al_{1-z-u}Ga_zSi_u)_5O_{12-u}N_u:Ce_aPr_b$ wherein $0 \leq x \leq 1$, $0 \leq y \leq 1$, $0 < z \leq 0.1$, $0 \leq u \leq 0.2$, $0 < a \leq 0.2$ and $0 < b \leq 0.1$, such as $Lu_3Al_5O_{12}:Ce^{3+}$ and $Y_3Al_5O_{12}:Ce^{3+}$, $(Sr_{1-a-b-c}Ca_bBa_c)Si_xN_yO_z:Eu_a^{2+}$ wherein $a=0.002-0.2$, $b=0.0-0.25$, $c=0.0-1.0$, $x=1.5-2.5$, $y=0.67-2.5$, $z=1.5-4$ including, for example, $SrSi_2N_2O_2:Eu^{2+}$ and $BaSi_2N_{0.67}O_4:Eu^{2+}$, $(Sr_{1-u-v-x}Mg_uCa_vBa_x)(Ga_{2-y-z}Al_yIn_zS_4):Eu^{2+}$ including, for example, $SrGa_2S_4:Eu^{2+}$, $(Sr_{1-x}Ba_x)_2SiO_4:Eu$, wherein $0 < x \leq 1$, including, for example, $BaSrSiO_4:Eu^{2+}$, $(Ca_{1-x-y-a-b}Y_xLu_y)_3(Sc_{1-z}Al_z)_2(Si_{1-x-y}Al_{x+y})_3O_{12}:Ce_aPr_b$ wherein $0 \leq x \leq 1$, $0 \leq y \leq 1$, $0 < z \leq 1$, $0 \leq u \leq 0.2$, $0 < a \leq 0.2$ and $0 < b \leq 0.1$, such as $Ca_3Sc_2Si_3O_{12}:Ce^{3+}$, and more other suitable inorganic luminescent materials are discussed in the context of FIG. 2c.

More in particular, examples of organic phosphors are green emitting organic dyes such as perylene derivatives such as Lumogen F materials 083 (yellow), 170 (yellow), 850 (green).

Suitable quantum dot are cadmium selenide (CdSe) with a shell such as cadmium sulfide (CdS) and zinc sulfide (ZnS), or cadmium free quantum dots such as indium phosphide (InP), and copper indium sulfide (CuInS2) and/or silver indium sulfide (AgInS2).

FIG. 1b discloses a cross-sectional view of a subsequent embodiment of the solid state light emitter package 180. The solid state light emitter package 180 is similar to the solid state light emitter packet 100 of FIG. 1a, but differs with respect to the points that are discussed hereinafter. The solid state light emitting dies 132, 142, 156 are so-termed flip-chip solid state light emitting dies 132, 142, 156, which means that both electrodes of the solid state light emitting dies 132, 142, 156 are located at one side and, as such, no wire bonds are needed to provide electrical energy to them. For completeness, the subsequent solid state light emitter dies are provided: a first blue emitting solid state light emitter die 132, a red emitting solid state light emitter die 142 and a second blue emitting solid state light emitter die 152. Furthermore, the optical luminescent converter 122 is different from the luminescent converter 120. In the embodiment of FIG. 1b, the luminescent converter 122 does not comprise the Silicone or another matrix polymer and the luminescent material is directly provided on top of the second blue emitting solid state light emitter die 152. The luminescent material is, for example, an inorganic phosphor which is resistant against heat that is generated in the second blue emitting solid state light emitter die 152. Also the optical element 103 is larger than the optical element 102 of FIG. 1a. The optical element 103 is, for example, Silicone and completely fills the space in between the outer surfaces 104 of the solid state light emitter package, the solid state light emitters 132, 142, the luminescent converter 122 and the light exit window. Thus, all light, which is generated in the first blue emitting solid state light emitter die 132, the red emitting solid state light emitter die 142 and the luminescent converter 122, is received by the optical element and because of some internal reflections in the optical element at least some of the greenish light is mixed with the first blue light and/or the red light before it is emitted through the light exit window. Note that the optical element 103 may also be made of glass and may be provided with a few recesses to receive the solid state light emitter dies 132, 142, 152. In order to obtain a good optical contact between such an optical element 103 of glass and the solid state light emitter dies 132, 142, 152, the solid state light emitter dies 132, 142, 152 may be glued to the optical element 103 of glass.

FIG. 1c schematically presents another embodiment of a solid state light emitter package 190. The solid state light emitter package 190 is similar to the solid state light emitter package 180 of FIG. 1b. A difference is related to the outer surfaces of the solid state light emitter package 190. The solid state light emitter package 190 is manufactured on a bottom plate/substrate 192 on which an edge 116 is provided, which is triangular in a cross-sectional view. At least one of the surfaces of the edge 116, which is a surface 118 which faces towards the solid state light emitter dies 132, 142, 152, is light reflective (specular, or diffusely reflective), such that first blue, red and greenish light that is trapped within the Silicone 103, or which is emitted into a sideward direction, is reflected towards the light exit window 114. In the example of FIG. 1c, the Silicone 103 (which is the optical element), is drawn with a curved surface. Such a curved surface may be the result of providing a drop of Silicone on a semi-finished solid state light emitter package which comprises the bottom plate/substrate 192, the edge 116 and the first blue emitting solid state light emitter die 132, the red emitting solid state light emitter die 142 and the second blue emitting solid state light emitter die 152 with luminescent converter 122. The drop of Silicone may naturally obtain the presented shape and after curing this is the final shape of the optical element/Silicone element 103.

Figure 9:
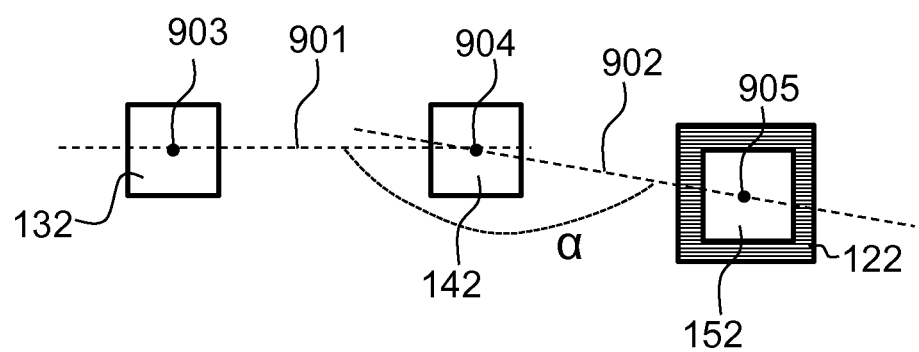
FIG. 9 presents in a top-view an arrangement of three solid state light emitter dies.

FIG. 9 presents an example of how, for the embodiment of, e.g. FIG. 1b and/or FIG. 1c, seen in a top-view, the red emitting solid state light emitter die 142, the blue emitting solid state light emitter die 132 and the further solid state light emitter die 152 (enclosed by the luminescent converter 122) are arranged with respect of each other. The red emitting solid state light emitter die 142 is arranged in between the blue emitting solid state light emitter die 132 and the further solid state light emitter die 152. In this context "in between" is defined by: when a first virtual line 901 is drawn through a center 904 of the red emitting solid state light emitter die 142 and a center 903 of the blue emitting solid state light emitter die 132, and when a second virtual line 902 is drawn through the center 904 of the red emitting solid state light emitter die 142 and a center 905 of the further solid state light emitter die 152, a smallest angle α between the first virtual line 901 and the second virtual line 902 is within the range from 120 degrees to 180 degrees.

FIGS. 2a to 2c schematically show further embodiments of solid state light emitter packages 200, 280, 290.

FIG. 2a presents a solid state light emitter package 200 which is a variation of the solid state light emitter package 100 of FIG. 1a and solid state light emitter package 180 of FIG. 1b. Similar to the solid state light emitter package 180 of FIG. 1b, the solid state light emitter dies 132, 142, 152 are the so-termed flip-chip which comprise their electrodes at one side of the solid state light emitter dies 132, 142, 152. However, this and other embodiments are not limited to the use of flip-chip solid state light emitter dies 132, 142, 152. Instead of flip-chip solid state light emitter dies 132, 142, 152, this embodiment may comprise solid state light emitter dies which must be electrically connected by means of a wire bond such as discussed in the context of FIG. 1a. The solid state light emitter package 200 is further similar to the solid state light emitter package 100 of FIG. 1a with respect to the type of luminescent converter 120. The solid state light emitter package 200 comprises a luminescent converter 120 which is made of a light transmitting matrix polymer, for example Silicone, in which luminescent particles are dispersed or molecules are dissolved. In the embodiment of FIG. 2a, the optical element at least comprises a space filled with a light transmitting material, for example, Silicone 102 and comprises a light transmitting or transparent wall 105. Using such a wall may be advantageous in the manufacturing process of the solid state light emitter package 200. For example, before the luminescent converter 120 and the Silicone 102 is applied to the solid state light emitter package 200, the light transmitting wall 105 may be placed in between the red emitting solid state light emitter die 142 and the second blue emitting solid state light emitter die 152 to define the location of the future interface between the luminescent converter 120 and the Silicone 102. Defining such a position may be desired when the luminescent material of the luminescent converter 120 has an absorption color distribution such that a significant portion of the first blue light is also absorbed when the first blue light impinges on the luminescent material and, thus, that it must be prevented that the luminescent converter comes too close to the first blue emitting solid state light emitter die 132. Thus, by creating a long enough spatial separation between the first blue emitting solid state light emitter die 132 and the luminescent converter 120, it is prevented that when the first blue emitting solid state light emitter die 132 emits the first blue light (such that the first blue light is transmitted through the light exit window 114) that also greenish light is generated by the luminescent material. It is assumed that the Silicone 102 and the luminescent converter 120 are well-optically coupled to the light transmitting wall 105 such that (as shown by arrows 199) at least some of the greenish light may be transmitted through the light transmitting wall 105 to the Silicone 102 and that some red light may be transmitted through the light transmitting wall 105 into the luminescent converter 120.

FIG. 2b presents a solid state light emitter package 280 which is similar to previously discussed solid state light emitter packages, however, with one important difference that the luminescent converter 124 is significantly larger and covers the second blue emitting solid state light emitter die 152 and the red emitting solid state light emitter die 142. Consequently, the luminescent converter 124 receives the red light and the second blue light (which is converted by the luminescent material towards greenish light). Furthermore, as a consequence, the Silicone 102 is only provided on top of the first blue emitting solid state light emitter 132. As shown in FIG. 2b, the luminescent converter 124 and the Silicone 102 are in contact with each other and are optically coupled to each other such that first blue light may be transmitted into the luminescent converter 124 and such that greenish light and red light may be transmitted into the Silicone 102. Furthermore, the luminescent converter 124 may comprise an inorganic phosphor of which particles are dispersed in the matrix polymer of the luminescent converter 124. The particles of the inorganic phosphor act for light that is not absorbed according to the absorption color distribution as scattering particles. Thus, the greenish light and the red light (and the first blue light this is received from the Silicone 102) are scattered by the particles of the inorganic phosphor and, as such, these different color of light are well-mixed before they are transmitted through the light exit window 114. In the solid state light emitter package 100 of FIG. 1a, the luminescent converter 120 also did this up to a relatively low level, but in the solid state light emitter package 280 of FIG. 2b the luminescent converter 124 contributes up to a large extent to the mixing of light and, as such, the luminescent converter 124 forms together with the Silicone 102 the optical element of the solid state light emitter package 280. Note that this embodiment works well when the absorption color distribution of the luminescent material does not overlap, or only minimally overlap, with the wavelengths of the first blue light. Alternatively, only the luminescent converter 124 is the optical element which mixes light of different colors and in between the Silicone 102 and the luminescent converter 124 an opaque wall is provided (which might be reflective) such that the first blue light does not enter into the luminescent converter 124.

FIG. 2c presents a solid state light emitter package 290 which is similar to the solid state light emitter package 280 of FIG. 2b. A difference is that the luminescent converter 126 completely fills a space between the outer walls 104 of the solid state light emitter package 290 and that no Silicone area is present. The luminescent converter 126 is the optical element which mixes the first blue light, red light and greenish light because it directly receives from the first blue emitting solid state light emitter die 132, the red emitting solid state light emitter die 142, and the second blue emitting solid state light emitter die 152 the first blue light, the red light and the second blue light. The embodiment of FIG. 2c works well when the absorption color distribution of the luminescent material of the luminescent converter 126 has almost no overlap with the light emission distribution of the first blue emitting solid state light emitter die 132. Thus, wavelengths of the first blue light do almost not fall within the absorption color distribution. In other words, the wavelengths of the first blue light at least fall outside wavelengths of the full width half maximum range of the absorption color distribution. It is to be noted that, in an embodiment, not all second blue light is converted towards greenish light and that, when the second blue emitting solid state light emitter die 152 receives electrical energy, the resulting light emission is a combination of second blue light and greenish light. This combination has a color point somewhere in between a color point for pure blue light, and a color point of the greenish light. This results in still a relatively large gamut for the light emission of the solid state light emitter package 290 and the CRI of light having a color point close to the black body line remains relatively large. It might also that a relatively small portion of the first blue light, for example, less than 20% of the first blue light, is still absorbed by the luminescent material and converted towards greenish light. Than the color point of the light that is emitted when the first blue emitting solid state light emitter die 132 receives electrical power slightly shifts towards green, but overall the gamut of the solid state light emitter remains relatively large and still a relatively large CRI can be obtained.

In the embodiment of the FIG. 2c, the luminescent material of the luminescent converter may act as scattering particles for wavelengths outside the absorption color distribution of the luminescent material. This results in a good mixing of the different colors of light. In particular inorganic phosphors are advantageous scattering particles for wavelengths outside the absorption color distribution. In an embodiment, the luminescent converter may also comprise means to scatter the light that is transmitted through the luminescent converter. Volume scattering of light is achieved by introducing transitions in refractive index in a material. This can be done by adding particles of different refractive index in a matrix material. For efficiency reasons, the absorption of light by the particles should be low. Typical materials used for scattering particles are: $TiO_2$, $SiO_2$, ZnO, $Al_2O_3$, $BaSO_4$. As an alternative for solid scattering particles, gas or even liquid bubbles could be introduced. In the embodiments of FIG. 1a to 1c, FIG. 2a to 2b, the Silicone 102, 103 (the optical element) may also comprise such scattering means for better mixing different colors of light. Alternatively, surface scattering could be used, in which the above named particles are not mixed in the matrix (the Silicone or another transparent material) but applied at the top of or on top of the material. Alternatively, roughening of the surface of the matrix material itself will help scattering the light.

The embodiment of FIG. 2c may also be used to discuss another embodiment. In this another embodiment, the solid state light emitter package 291 comprises the first blue emitting solid state light emitter die 132, the red emitting solid state light emitter die 142, and a further solid state light emitter die 253. This further solid state light emitter die 253 emits, for example, violet light, or ultraviolet light. When the further solid state light emitter die 253 emits ultraviolet light, the luminescent material in the light transmitting material 102 is configured to absorb the ultraviolet light and to convert this absorbed ultraviolet light towards greenish light, as discussed previously. When the further solid state light emitter die 253 emits violet light, the luminescent material in the light transmitting material 102 is configured to absorb at least a portion of the violet light and to convert the absorbed violet light towards greenish light, as discussed previously. The amount of luminescent material may be such that a portion of the violet light is absorbed and converted towards greenish light such that a color point of light which is the combination of the remaining violet light and the greenish light is somewhere in between a blue color point and a green color point. The amount of the luminescent material may also be such that about all violet light is absorbed and converted towards greenish light such that, when (only) the further solid state light emitter die 253 receives electrical energy, greenish light is emitted by the sold state light emitter package 291.

In both embodiments of the solid state light emitter package 290, 291 of FIG. 2c, an optional green emitting solid state light emitter may be provided which emits green light having a color point of pure green light. This enhances the gamut of the solid state light emitter package 290, 291. In general, embodiments of the solid state light emitter package 290, 291 may comprise additional solid state light emitter dies (with or without an additional specific luminescent material) to provide the solid state light emitter package 290, 291 with additional means to emit other colors of light, or to emit at larger light intensities, or to enlarge the gamut, or to increase the CRI of emitted light having a color point close to the black body line.

In general, in the context of the embodiments of the solid state light emitter packages 290, 291 of FIG. 2c, the requirements for the first blue light, the second blue light, and the luminescent material are: i) a suitable luminescent material is a green emitting luminescent material which has a substantially higher absorption at short-wavelength blue ("the second blue light") than at long-wavelength blue ("the first blue light"), ii) the luminescent material has an emission maximum between 480 and 600 nanometer, in a further embodiment, 520-570 nanometers, and an Full Width Half Maximum of minimum 30 nm, in a further embodiment, minimum 50 nm, iii) with an absorption of 40-100%, possibly 70-100% of the second blue light, and an absorption of 0-40%, possibly 0-20% of the first blue light, iv) the spectral range of the second blue light having its emission maximum at 380-460 nm, preferably 400-440 nm, and the spectral range of the first blue light having its emission maximum at 440-500 nm, preferably 460-480 nm. Suitable luminescent materials are: SSONE ($SrSi_{(2)}N_{(2)}O_{(2)}$:Eu), SIAlON ($SrSi_{(2)}N_{(2)}O_{(2)}$:Eu), SAE ($Sr_4Al_{14}O_{25}$:Eu), GaYAG (($Y_xGa_{(1-x)})_3Al_5O_{12}$:Eu), a lucid green quantum dot, BAM:Mn (BaMgAl10O17:Mn), BBG (BaMgAl10O17:Eu,Mn), BSONE ($BaSi_{(2)}N_{(2)}O_{(2)}$:Eu), and different Silicates ($A_2Si(OD)_4$:Eu with A=Sr, Ba, Ca, Mg, Zn and D=F, Cl, S, N, Br; BOSE=(SrBaCa)2SiO4:Eu; (Ba2MgSi2O7: Eu2+; Ba2SiO4:Eu2+); (Ca,Ce)3(Sc,Mg)2Si3O12.

Figure 3A:
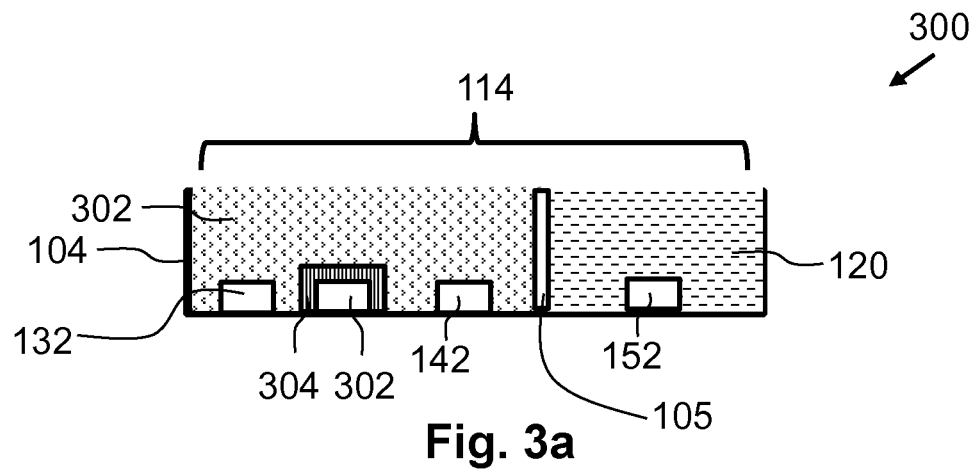

FIG. 3a schematically shows an embodiment of a solid state light emitter package 300 which is similar to solid state light emitter package 200 of FIG. 2a. A difference is that an additional solid state light emitter die 302 is provided. The additional solid state light emitter die 302 may emit third blue light. On top of the additional solid state light emitter die 302 is provided a second luminescent converter 304 which comprises luminescent material that converts a portion of the third blue light towards yellow light. The combination of the additional solid state light emitter die 302 and the second luminescent converter 304 may be configured to emit white light that has a color point close to the black body line in the CIEXYZ color space. The white light is a combination of the third blue light and the yellow light. The additional solid state light emitter die 302 may be controlled to emit light when the solid state light emitter package 300 has to emit a color of light that is near or close to the black body line and/or when a relatively large light output of white light must be generated. Furthermore, emitting light with the additional solid state light emitter die 302 also increases the color rending index of the emitted light when light is emitted with a color point near the black body line. Note that the position of the additional solid state light emitter die 302 is in between the red light emitting solid state light emitting die 142 and the first blue emitting solid state light emitting die 142. In other embodiments, the additional solid state light emitter die 302 may also be arranged in between the outer walls 104 and the first blue emitting solid state light emitting die 142, or in between the red light emitting solid state light emitting die 142 and the light transmitting wall 105.

Figure 3B:
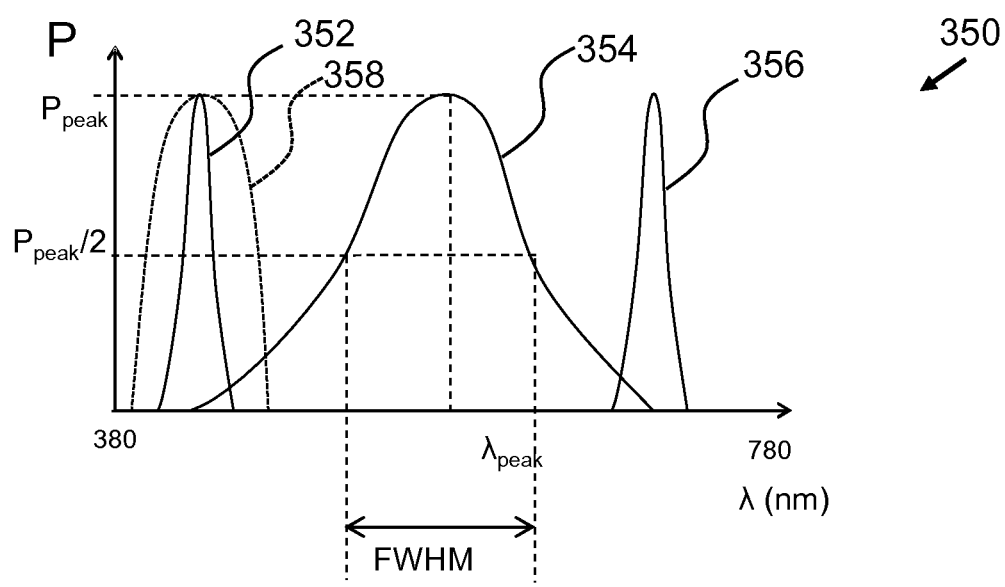

FIG. 3b schematically shows in a chart 350 some light emission spectra 352, 356, an emission color distribution 354 and an absorption color distribution 358. The x-axis of the chart 350 represents a wavelength λ of light. The y-axis represents the light power P. The second blue emitting solid state light emitter dies of previous embodiments, and optionally also the first blue emitting solid state light emitter dies emit, for example, blue light according to light emission spectrum 352. The red emitting solid state light emitter die emits, for example, red light according to light emission spectrum 356. The luminescent material of previous embodiments has, for example, an absorption color distribution according to dashed line 358. In the example of FIG. 3b the absorption color distribution overlaps with the light emission spectrum 352 and, as such, when the luminescent material receive the light that is emitted by the second blue emitting solid state light emitter die, this light is absorbed and converted towards light of another color. The light that is emitted by the luminescent material is emitted according to emission color distribution 354. A peak wavelength $\lambda_{peak}$ of the emission color distribution 354 is within the cyan and/or green spectral range, for example, in between 490 nanometer and 570 nanometer, or alternatively, in between 500 nanometer and 560 nanometer, or in yet a further alternative embodiment, in between 505 nanometer and 550 nanometer. In addition, the emission color distribution 354 is relatively wide, which means that the full width half maximum FWHM value is larger than 40 nanometers. In an embodiment, the FWHM value is larger than 50 nanometers, and in another embodiment, the FWHM value is larger than 60 nanometers. The light according to the emission color distribution at least appears to the human naked eye as greenish light, and, in an embodiment, this light is experienced as green light. In another embodiment, the light emission spectrum 352 of the second (blue emitting) solid state light emitter die is at least partially in the ultraviolet spectral range and the absorption spectrum 358 is also more located in the ultra violet spectral range such that the ultraviolet light is absorbed by the luminescent material and converted towards greenish light.

Figure 5A:
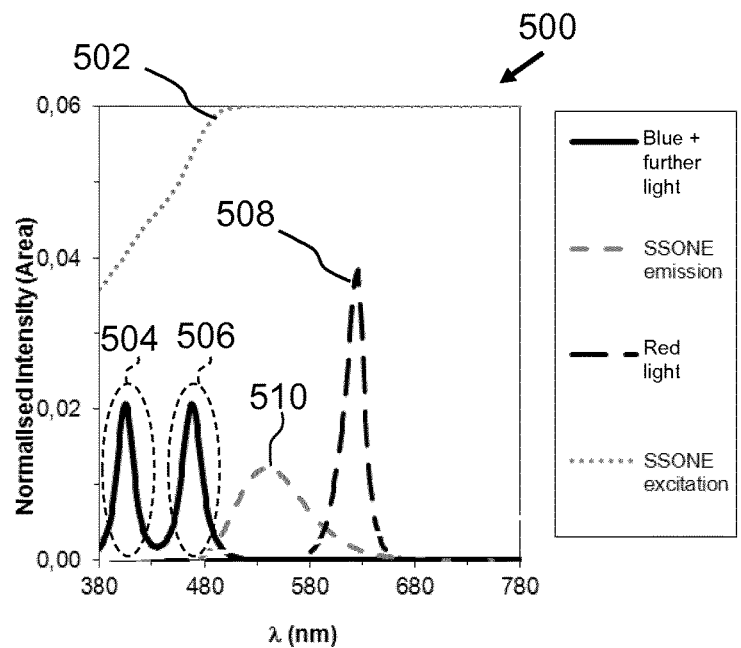
FIG. 5a presents light emission and absorption spectra of a first specific example.
Figure 5B:
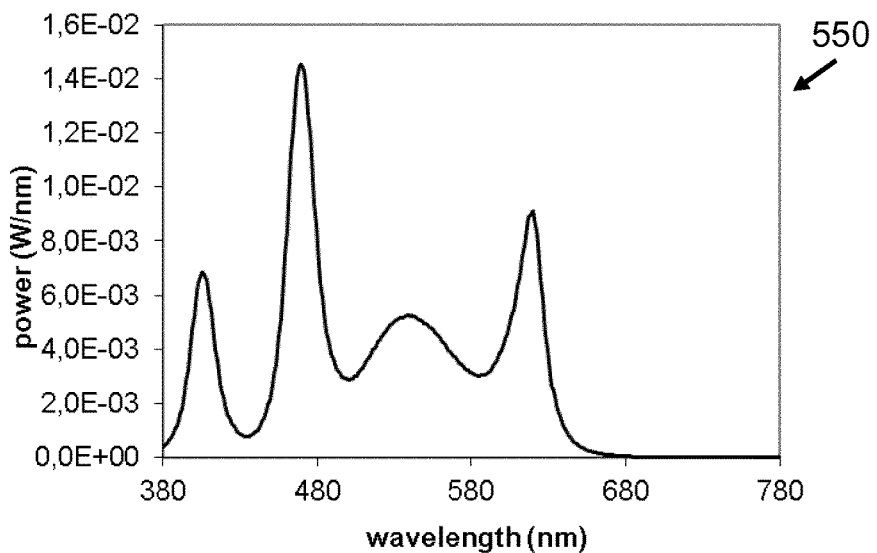
FIG. 5b presents a light emission spectrum of light of a color temperature of about 6500K generated by the embodiment of the first specific example.
Figure 6A:
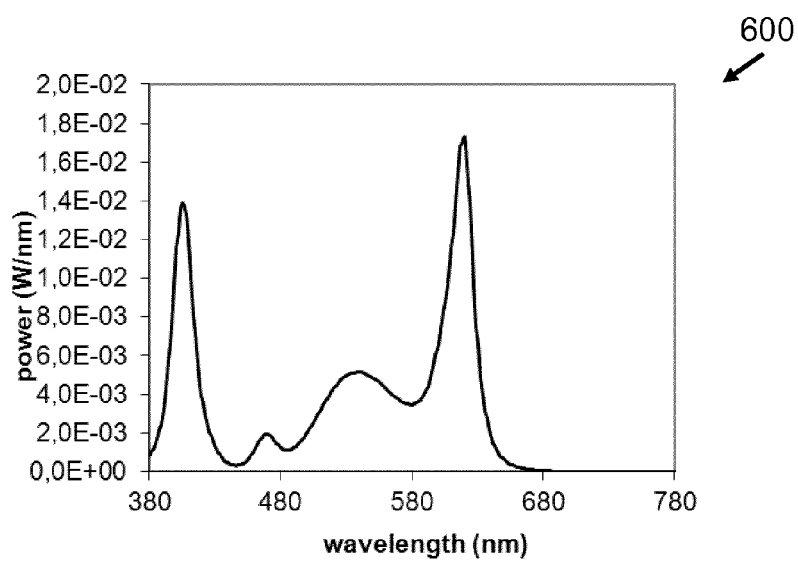
FIG. 6a presents a light emission spectrum of light of a color temperature of about 2725K generated by the embodiment of the first specific example.
Figure 6B:
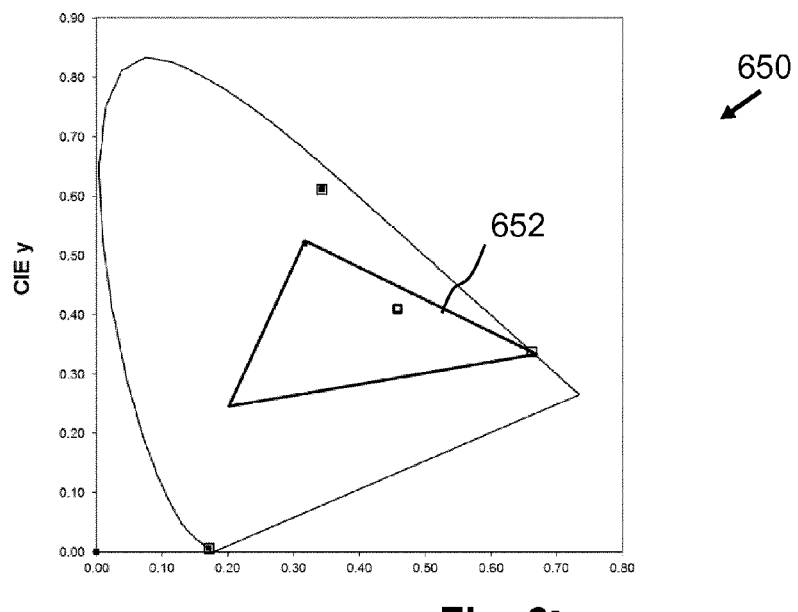
FIG. 6b presents a gamut of the embodiment of the first specific example.

FIG. 5a presents in a chart 500 a first specific example of spectral ranges of emitted light, an absorption color distribution and an emission color distribution of a specific luminescent material. The example relates to a solid state light emitter package 290, 291 as presented in FIG. 2c. In the example, one solid state light emitter die emits blue light according to emission spectrum 506 which has a peak wavelength at 465 nanometers. A red emitting solid state light emitted die emits red light according to light emission spectrum 508 which has a peak wavelength of 620 nanometers. A further solid state light emitter die emits violet/blue light according to light emission spectrum 504 which has a peak wavelength at about 405 nanometers. In the example, a luminescent material named SSONE (SrSi$_{(2)}$N$_{(2)}$O$_{(2)}$:Eu) is provided which has an absorption color distribution 502 and emits light according to emission color distribution 510. Note that the absorption color distribution 502 is presented in an inverse manner, which means that when the line follows the top line of the chart 500 (normalized intensity 0.06) than the luminescent material SSONE does not absorb light, and a distance between this top line and the line of the absorption color distribution 502 represents the amount of absorption of light of that specific wavelength, and, thus, the amount of excitation of the luminescent material by light of that specific wavelength. Thus, the absorption of light of wavelength of 380 nm is high, while the absorption of light of about 500 nanometers is relatively low. The peak wavelength of the emission color distribution is at about 535 nanometers and a full width half maximum of the emission color distribution is about 75 nanometers. When the amount of emitted first blue light (of spectrum 506) and the amount of emitted further light (of spectrum 504) has a ratio of 50%:50%, a specific amount of red light is emitted and a specific amount of luminescent material is used to create light with a color point close to the black body line of a color temperature of 6500 Kelvin, the total light emission of the solid state light emitter package corresponds to color distribution 550 of FIG. 2b. This light has a CRI of 83, and a R9 value of 85. A conversion efficiency of 209 Lumen/Wopt is obtained. When subsequently the ratio between further light and blue light is changed towards 96%:4% and the amount of emitted red light is adjusted, a light emission with a color point of about 2725 Kelvin can be obtained which has a CRI of 88 and a R9 value of 30. The color distribution 600 of this light emission is shown in FIG. 6a. In this example, only 64% of the further light is converted towards green light. A gamut 652 of this embodiment of the solid state light emitter package is presented the CIEXYZ color space 650 in FIG. 6b.

Light emission results of second specific of a solid state light emitter package according to one of the embodiment of FIG. 2c (in which also a green emitting solid state light emitter die is present) is presented in FIGS. 7a, 7b, 8a and 8b.

Figure 7A:
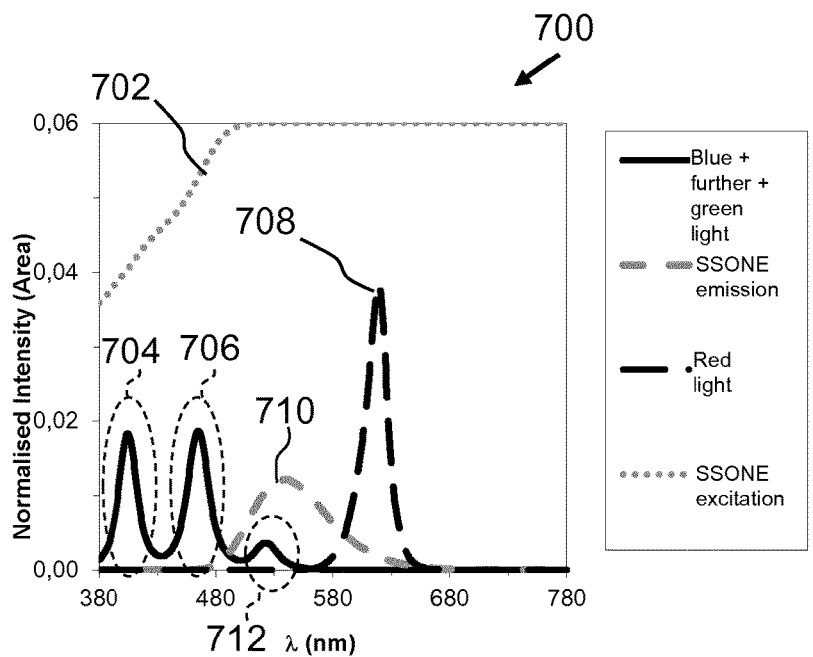
FIG. 7a presents light emission and absorption spectra of a second specific example.
Figure 7B:
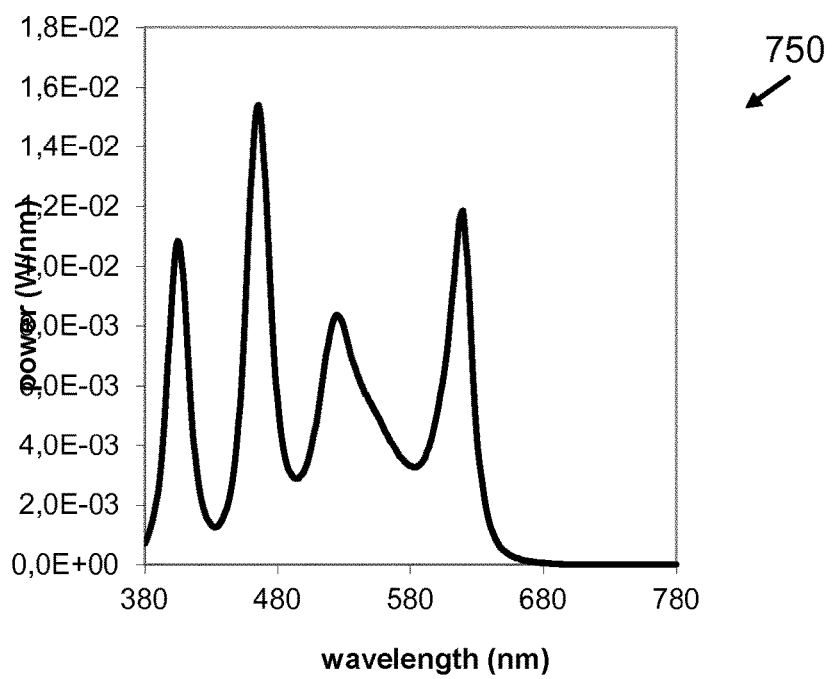
FIG. 7b presents a light emission spectrum of light of a color temperature of about 6500K generated by the embodiment of the second specific example.
Figure 8A:
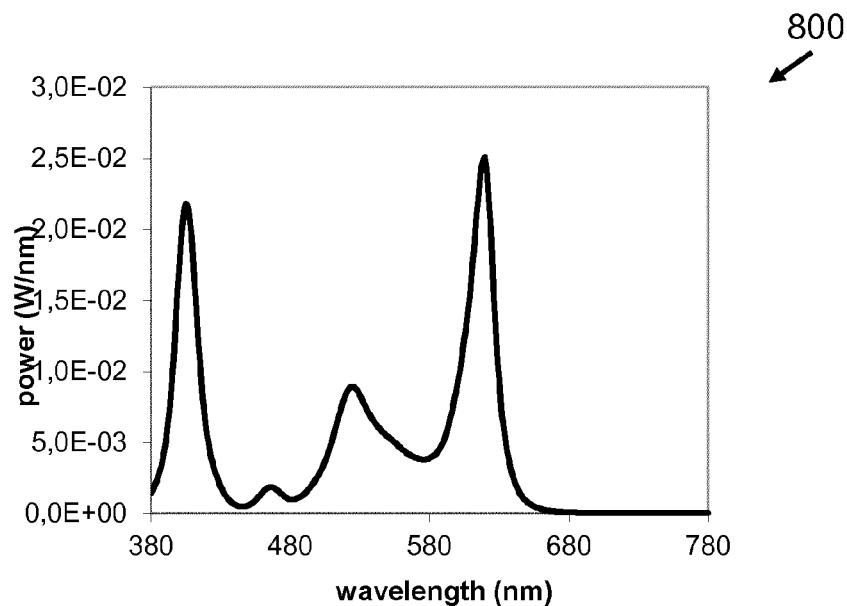
FIG. 8a presents a light emission spectrum of light of a color temperature of about 2725K generated by the embodiment of the second specific example.
Figure 8B:
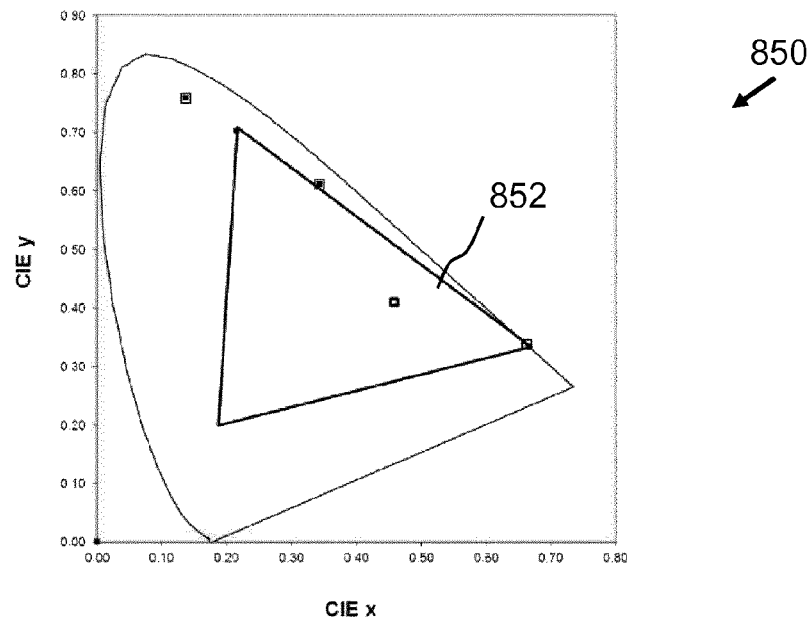
FIG. 8b presents a gamut of the embodiment of the second specific example.

FIG. 7a presents in a chart 700 a first specific example of spectral ranges of emitted light and an absorption and emission color distribution of a specific luminescent material. The example relates to a solid state light emitter package 290, 291 as presented in FIG. 2c and which comprises an additional green emitting solid state light emitter die. In the example, one solid state light emitter die emits blue light according to emission spectrum 706 which has a peak wavelength at 465 nanometers. A red emitting solid state light emitted die emits red light according to light emission spectrum 708 which has a peak wavelength of 620 nanometers. A further solid state light emitter die emits violet/blue light according to light emission spectrum 504 which has a peak wavelength at about 405 nanometers. The green emitting solid state light emitter die has an emission spectrum 712 with a peak wavelength of 523 nanometers. In the second specific example, a luminescent material named SSONE (SrSi$_{(2)}$N$_{(2)}$O$_{(2)}$:Eu) is provided which has an absorption color distribution 502 and emits light according to emission color distribution 510. Note that the absorption color distribution 502 is presented in an inverse manner, as discussed previously in the context of FIG. 5a. The peak wavelength of the emission color distribution 710 is at about 535 nanometers and a full width half maximum of the emission color distribution 710 is about 75 nanometers. When the amount of emitted first blue light (of spectrum 506), the amount of emitted further light (of spectrum 504) and the amount of the green light (of spectrum 712) is generated according to a ratio of 46%:45%:9%, a specific amount of red light is emitted and a specific amount of luminescent material is used to create light with a color point close to the black body line of a color temperature of 6500 Kelvin, the total light emission of the solid state light emitter package corresponds to color distribution 750 of FIG. 2b. This light has a CRI of 86, and a R9 value of 81. A conversion efficiency of 242 Lumen/Wopt is obtained. When subsequently the ratio between further light, the blue light and the green light is changed towards 85%:4%:11% and the amount of emitted red light is adjusted, a light emission with a color point near the black body line having a color temperature of about 2725 Kelvin can be obtained which has a CRI of 81.5. The color distribution 800 of the light emission of white light with a color temperature of 2725 Kelvin is shown in FIG. 8a. In this example, only 32% of the further light is converted towards green light. A gamut 852 of this embodiment of the solid state light emitter package is presented the CIEXYZ color space 850 in FIG. 6b.

Figure 4A:
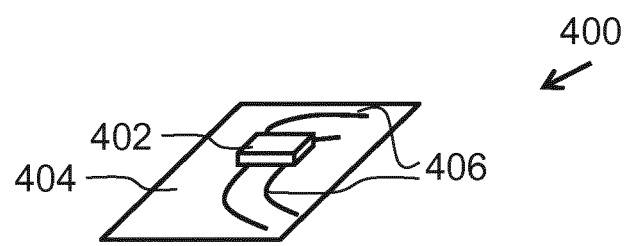

FIG. 4a schematically shows an embodiment of a light emission device 400. The light emission device 400 is a Level 2 integrated device which comprises solid state light emitter dies. The light emission device 400 comprises a substrate 404 or a foil on which electrically conductive tracks 406 are provided and comprises a solid state light emitter package 402 according to one of the previously discussed embodiments of the light emitter package 402. The solid state light emitter package 402 is electrically connected, for example, by soldering to the electrically conductive tracks 406. Note that in previous embodiments a cross-sectional view of the solid state light emitter packages is presented, while in FIG. 4a a three dimensional view is presented. The cross-sectional views may be cross-sectional views of such a box-shaped solid state light emitter package 402, but may also be cross-sectional views of differently shaped solid state light emitter packages, such as cylindrical shaped solid state light emitter packages.

Figure 4B:
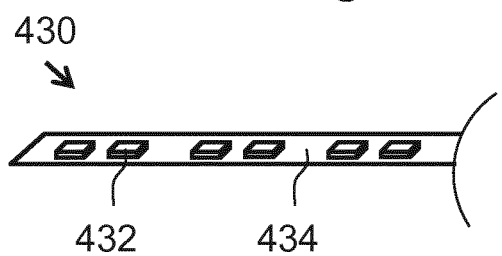

FIG. 4b schematically shows an embodiment of a flexible LED strip 430. The flexible LED strip comprises a flexible foil 434 which comprises electrically conductive tracks and comprises solid state light emitter packages 432. The electrically conductive tracks are arranged to provide power to the solid state light emitter packages 432. The flexible LED strip 430 may be connected to a driving circuitry which controls the amount of electrical energy that is provided to the different solid state light emitter dies of the solid state light emitter packages 432 such that different color of light can be generated with the flexible LED strip 430. It is to be noted that the term flexible LED strip implies that the solid state light emitter dies of the solid state light emitter packages 432 are Light Emitting Diodes.

Figure 4C:
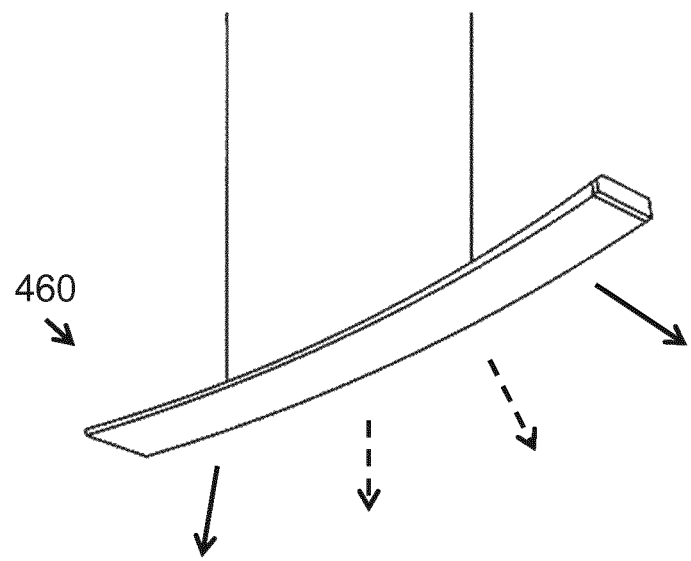

FIG. 4c schematically shows an embodiment of a luminaire 460. The luminaire 460 comprises one of the embodiments of the above discussed solid state light emitter packages, or comprises the light emission device of FIG. 4a, or comprises the flexible LED strip of FIG. 4b.

In summary, a solid state light emitter package, a light emitting device, a flexible LED strip and a luminaire are provided. The solid state light emitter package comprising i) at least three solid state light emitter dies which emit violet/blue light, red light and further light, respectively, ii) a luminescent converter with luminescent material, iii) an optical element for mixing at least portion of the light of the different colors of light and iv) a light exit window. The luminescent material at least partially converts the further light towards greenish light having a peak wavelength in the green or cyan spectral range and has a color emission distribution that is wide enough such that the solid state light emitter package is capable light with a high enough Color Rendering Index. The Color Rendering Index relates to light that has a color point close to the black body line.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A solid state light emitter package comprising:
   a blue emitting solid state light emitter die for emitting violet/blue light,
   a red emitting solid state light emitter die for emitting red light,
   a further solid state light emitter die for emitting further light, the further light comprising light of wavelengths in at least one of the ultra violet, violet or blue spectral ranges,
   a luminescent converter comprising luminescent material, the luminescent converter being arranged to receive the further light, the luminescent material being configured to absorb light within an absorption color distribution and to convert a portion of the absorbed light towards greenish light according to an emission color distribution, wherein the absorption color distribution at least partially overlaps with wavelengths of the further light, the emission color distribution has a peak wavelength in at least one of the cyan or green spectral range and has a specific width for obtaining a Color Rendering Index that is higher than a predefined minimum, the Color Rendering Index relates to light emitted by the solid state light emitter package when the solid state light emitter package emits light of a color point close to a black body line,
   a light exit window for transmitting light into an ambient of the solid state light emitter package, and
   an optical element being configured for mixing a portion of the greenish light with at least one of a portion of the violet/blue light and a portion of the red light before the light is emitted through the light exit window, wherein the red emitting solid state light emitter die is arranged in between the blue emitting solid state light emitter die and the further solid state light emitter die.

2. A solid state light emitter package according to claim 1, wherein the peak wavelength (λpeak) of the emission color distribution is within the range from nanometer to nanometer.

3. A solid state light emitter package according to claim 1, wherein a full width half maximum spectral width of the emission color distribution is at least 40 nanometer for increasing a Color Rendering Index of light emitted by the solid state light emitter package when the solid state light emitter package emits light of a color point close to a black body line.

4. A solid state light emitter package according to claim 1, wherein, when the further solid state light emitter die emits further light and if the further light is light in the blue spectral range, a portion at least 30% of the further light is absorbed by the luminescent material and a combination of the emitted greenish light and a remaining portion of the further light is emitted through the light exit window.

5. A solid state light emitter package according to claim 1, wherein the luminescent converter is a layer of the luminescent material that is provided on a surface of the further solid state light emitter die.

6. A solid state light emitter package according to claim 1, wherein the luminescent converter comprises a first light transmitting material in which the luminescent material is distributed, and wherein one or more light emitting surfaces of the further solid state light emitter die are covered by the first light transmitting material.

7. A solid state light emitter package according to claim 6, wherein one or more light emitting surfaces of the red emitting solid state light emitter die are also covered by the first light transmitting material thereby obtaining the optical element which at least partially mixes the greenish light with the red light.

8. A solid state light emitter package according to claim 6, wherein the absorption color distribution of the luminescent material may overlap with the spectrum of the violet/blue light to such an extent that not more than 30% of the violet/blue light is absorbed by the luminescent material, and wherein one or more light emitting surfaces of the blue emitting solid state light emitter die are also covered by the first light transmitting material thereby obtaining the optical element which at least partially mixes the greenish light with the violet/blue light.

9. A solid state light emitter package according to claim 1, wherein the optical element comprise a second light transmitting material that is optically coupled to the one or more light emitting surfaces of the blue emitting solid state light emitter die, the red emitting solid state light emitter die and the luminescent converter.

10. A solid state light emitter package according to claim 9, wherein the optical element further comprises a light transmitting wall arranged in between the second light transmitting material and the luminescent converter.

11. A solid state light emitter package according to claim 1, wherein the luminescent material is one of an organic phosphor, an inorganic phosphor, and particles showing quantum confinement and having at least in one dimension a size in the nanometer range, wherein examples of the particles are: quantum dots, quantum rods and quantum tetrapods.

12. A solid state light emitter package according to claim 1 further comprising at least one of:
  i) an additional blue emitting solid state light emitter die for emitting additional violet/blue light, the additional blue emitting solid state light emitter die being provided with a further luminescent material which at least absorbs a portion of the additional violet/blue light and which converts the absorbed light to a color emission distribution which has a peak wavelength in the yellow spectral range or orange spectral range, the additional blue emitting solid state light emitter die and the luminescent material being configured to emit light having a color point close to the black body line,
  ii) a green emitting solid state light emitter die for emitting green light.

13. A light emission device comprising at least one solid state light emitter package according to claim 1, the light emission device at least comprises a substrate provided with electrical conductive tracks to which the at least one solid state light emitter package is electrically coupled.

14. A flexible LED strip comprising the light emission device according to claim 13, wherein the substrate is flexible, has an elongate shape and on which a plurality of solid state light emitter package are provided and the solid state light emitting dies of the solid state light emitter package are light emitting diode dies.

15. A luminaire-comprising a solid state light emitter package according to claim 1, or comprising a light emission device according to claim 13 or comprising a flexible LED strip according to claim 14.

* * * * *